(12) United States Patent
Chang

(10) Patent No.: US 6,479,387 B2
(45) Date of Patent: Nov. 12, 2002

(54) METHOD FOR REDUCING MICRO-PARTICLE ADSORPTION EFFECTS

(75) Inventor: Ching-Yu Chang, I Lan Hsein (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/682,051

(22) Filed: Jul. 15, 2001

(65) Prior Publication Data

US 2002/0022372 A1 Feb. 21, 2002

(30) Foreign Application Priority Data

Aug. 17, 2000 (TW) ........................................ 89116593 A

(51) Int. Cl.⁷ ........................ H01L 21/44; H01L 21/302
(52) U.S. Cl. ........................ 438/692; 438/691; 438/753; 438/759
(58) Field of Search .................................. 438/691, 692, 438/753, 759

(56) References Cited

U.S. PATENT DOCUMENTS 6,042,741 A * 3/2000 Hosali et al. .............. 252/79.1

* cited by examiner

Primary Examiner—Alexander Ghyka
(74) Attorney, Agent, or Firm—Winston Hsu

(57) ABSTRACT

The present invention provides a method of reducing micro-particle adsorption effects during a CMP process, to thereby reduce micro-particle adsorption effects on a surface of a semiconductor wafer comprising a silicon nitride layer. The method uses polishing slurry containing anionic surfactant to change the zeta potential of the silicon nitride. Therefore, during the CMP process, the surface of the silicon nitride layer and the micro-particles bare the same type of charges, so as to reduce micro-particle adsorption effects on the surface of the semiconductor wafer.

19 Claims, 3 Drawing Sheets

METHOD FOR REDUCING MICRO-PARTICLE ADSORPTION EFFECTS

BACKGROUND OF INVENTION

1. Field of the Invention

The present invention relates to a method of reducing micro-particle adsorption effects in a semiconductor process, and more particularly, to a method of reducing micro-particle adsorption effects during a chemical mechanical polishing (CMP) of a shallow trench isolation process.

2. Description of the Prior Art

Shallow trench isolation (STI) process is the mostly used device isolation technique in semiconductor processes with a line-width less than 0.35 um. This is because the STI fabrication process has both the advantages of excellent electric isolation effects and higher integration of semiconductor devices.

The prior method of fabricating STI first involves performing an reactive ion etching (RIE) process to form a shallow trench on a surface of a silicon substrate, followed by using a chemical vapor deposition (CVD), such as a high density plasma chemical vapor deposition (HDPCVD), to fill a silicon dioxide dielectric layer in the trench. A chemical mechanical polishing (CMP) process is then performed to have the surface of the semiconductor wafer form a plane surface. However, during the STI fabrication process related to the prior art, the process suffers a problem of unreliable control of micro-particles on the surface of the semiconductor wafer. That is because the interface of different materials on the surface of semiconductor wafer causes micro-particle adsorption during the CMP process.

Please refer to FIG. 1 and FIG. 2. FIG. 1 and FIG. 2 are schematic diagrams of performing a STI process on a surface of a semiconductor wafer 10. As shown in FIG. 1, the semiconductor wafer 10 comprises a silicon substrate 12, a silicon oxide layer 16 formed on the surface of the silicon substrate 12, and a silicon nitride 18 formed on the surface of silicon oxide 16. The prior method first involves using traditional photolithographic and etching processes to form a trench 14 on the surface of the silicon substrate 12. A HDPCVD process is then performed to deposit a HDP oxide layer 20 on the surface of the semiconductor wafer 10 and fills the trench 14 with HDP oxide layer 20.

As shown in FIG. 2, a CMP process is then performed. When performing the CMP process, the semiconductor wafer 10 is fixed horizontally and rotated on a polish pad of a CMP machine (not shown). A liquid supply system connected with the CMP machine sprays CMP polishing slurry on the surface of the rotating polish pad, so that the polishing slurry is evenly distributed on the surface of the polish pad and reacts with HDP oxide layer 20 on the surface of the semiconductor wafer 10. At the same time, the semiconductor wafer 10 is pressed downward to contact the surface of the rotating polish pad so as to perform mechanical polishing on the HDP oxide layer 20. As a result, the CMP process makes use of a chemical reaction provided by the slurry and a mechanical polishing provided by the-polish pad to rapidly remove the HDP oxide layer 20 by a predetermined thickness. Finally, the silicon nitride 18 underlying the HDP oxide layer 20 on the surface of the semiconductor wafer 10 is used as a stop layer. Operators can use refraction rate variation with time, a sudden change of polish pad temperature, or a friction difference to determine the endpoint of the CMP process.

The basic polishing slurry (pH=10) causes the Zeta potential on the surface of the silicon nitride layer 18 to be positive, but the Zeta potential on the HDP oxide layer 20 that fills the trench 14 is negative. Therefore, the micro-particle 22 with negative electrons of the polishing slurry is adsorbed to the surface of the silicon nitride 18, and the surface of the HDP oxide layer 20 absorbs the micro-particle 24 with positive electrons 24. Wherein the micro-particle 24 may be the silicon nitride particles with positive electrons that are abraded by the CMP process, and the micro-particles 22, 24 which are adsorbed by static electricity on the surface of the semiconductor wafer 10 are not easily removed by a subsequent cleaning process.

Please refer to FIG. 3 of the relationship between the zeta potential and the pH value. As shown in FIG. 3, in the environment of the pH=10, the surface potential of silicon nitride layer 18 is between 10 to 20 millivolt (mV) and the surface potential of HDP oxide layer 20 is between 5 to 20 mV. The result shows that the micro-particle adsorption effects during the CMP process is major caused by the different interface characteristics on the surface of the semiconductor wafer.

SUMMARY OF THE INVENTION

It is therefore an objective of the present invention to provide a method of reducing micro-particles adsorption effects on the surface of the semiconductor wafer in a semiconductor process.

It is therefore another objective of the present invention to provide a method of reducing micro-particles adsorption effects on the surface of a semiconductor wafer in a CMP of STI process.

The present invention provides a method of reducing micro-particle adsorption effects during semiconductor processes, to thereby reduce micro-particle adsorption effects on a surface of a semiconductor wafer that comprises a silicon nitride layer. The method uses a polishing slurry containing surfactant to perform the CMP process, so that the surface of the silicon nitride layer and the micro-particles bare the same type of charges, so thereby reducing the micro-particle adsorption effects on the surface of the semiconductor wafer.

Using the surfactant in the polishing slurry changes the interface characteristics on the surface of semiconductor wafer; the present invention can efficiently reduce the micro-particle adsorption effects on the surface of the semiconductor wafer.

These and other objectives of the present invention will no doubt become obvious to those of ordinary skill in the art after reading the following detailed description of the preferred embodiment, which is illustrated in the various figures and drawings.

DETAILED DESCRIPTION

Figure 4:
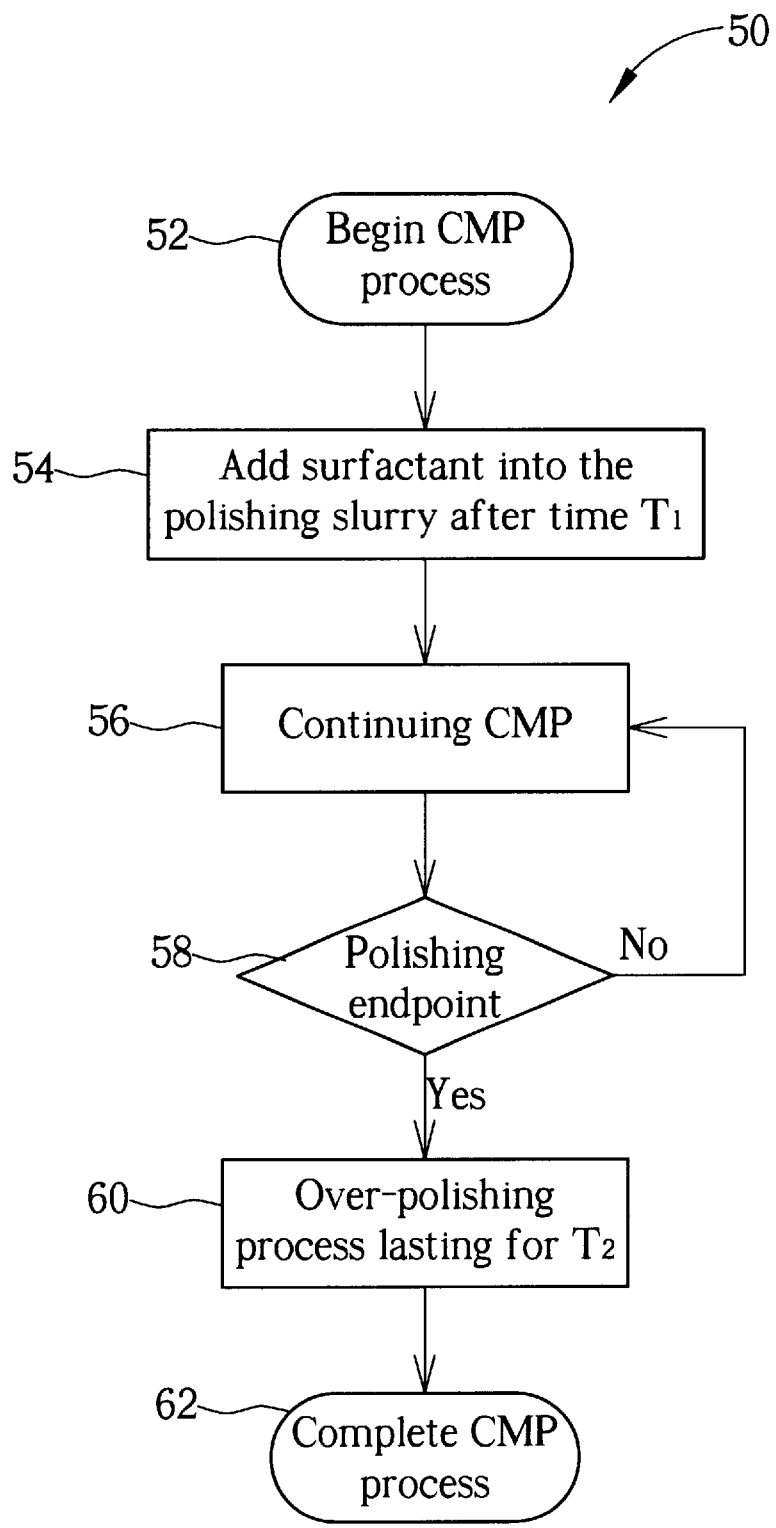
FIG. 4 is a function block diagram of a CMP fabrication process according to the present invention.

Please refer to FIG. 4. FIG. 4 is a function block diagram 50 of a semiconductor wafer performing CMP process according to the present invention. The surface of the semiconductor wafer comprises a silicon nitride layer and a silicon oxide layer. The silicon oxide layer is made of silicon dioxide, phosphosilicate glass, borophosphosilicate glass or HDP oxide. As shown in FIG. 4, in the present invention step 52 is first performed, that is, polishing slurry is sprayed with an equal distribution on the rotating polish pad (not shown), followed by starting the CMP process with the process time measured.

The present polishing slurry used in the silicon dioxide CMP process comprises abrasive, deionized water (DI water), alkaline solvent, and buffer solution. Wherein the abrasive is colloidal silica solution of fumed silica with the particle size ranging from 170 to 230 nm. The alkaline solvent is made of potassium hydroxide (KOH), sodium hydroxide (NaOH) or ammonia solution etc. The buffer solution is used to control the pH value of the polishing slurry in a basic environment of pH=10.

Then, after $T_1$ second, step 54 is performed to add a predetermined amount of surfactant into the polishing slurry. $T_1$ is an experimental value. Taking a HDP oxide layer with a thickness of 1000 angstroms (A) as an example, $T_1$ is between 45 and 65 seconds. It should be noticed that the value of $T_1$ is dependant on CMP process parameters, such as head down force, head rotation speed, platen rotation speed, polish pad type or polishing slurry type.

In the preferred embodiment of the present invention, the surfactant is an anionic surfactant. However, the application of the present invention is not limited to an anionic surfactant, the suitable surfactant comprise cationic surfactants, anionic surfactants, amphoteric surfactants, nonionic surfactants or a mixture of them. In the preferred embodiment quaternary ammonium halide surfactants, phosphate surfactants, dialkyl sulfosuccinates, betaines, sulfate surfactants, ethylene oxide derivatives (EOD), phenols, acid amines or the mixture of them is used.

Step 56 is then performed to continue the CMP process. Step 58 is performed to use the endpoint determination technique to judge the polishing endpoint of CMP process. At this moment, if the polishing endpoint is not achieved, the semiconductor wafer goes back to perform step 56. If the polishing endpoint is achieved, step 60 is subsequently performed. The step 60 is an over-polishing process lasting for $T_2$ seconds. In order to have a global planarization surface of semiconductor wafer, that is, to reduce the height difference between the center and edge of the semiconductor wafer, $T_2$ is suggested between 15 and 25 seconds, or for 30% of $T_1$. On completion of step 60, the CMP process is finished.

In another embodiment of the present invention, the surfactant can be added to the slurry before or at the polishing endpoint. In addition, according to the spirit of the present invention, a scrubbing step performed one to several times is done after completing the CMP process to clean micro-particles on the surface of the semiconductor wafer. Therefore, surfactant-containing deionized water can also be used in the scrubbing process to wash the surface of the semiconductor wafer. In the other embodiment, the surfactant may be added in the standard cleaning (SC-1) step after completing CMP process, that is, the SC-1 cleaning solvent used in the standard cleaning step comprises the surfactant.

Figure 1:
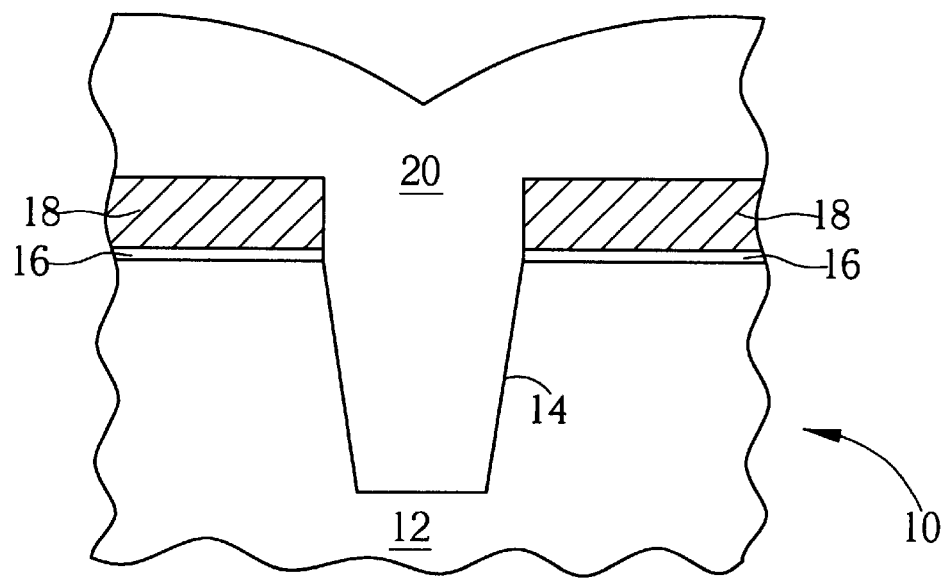
FIG. 1 and FIG. 2 are schematic diagrams of an STI process on a semiconductor wafer according to the prior art.
Figure 2:
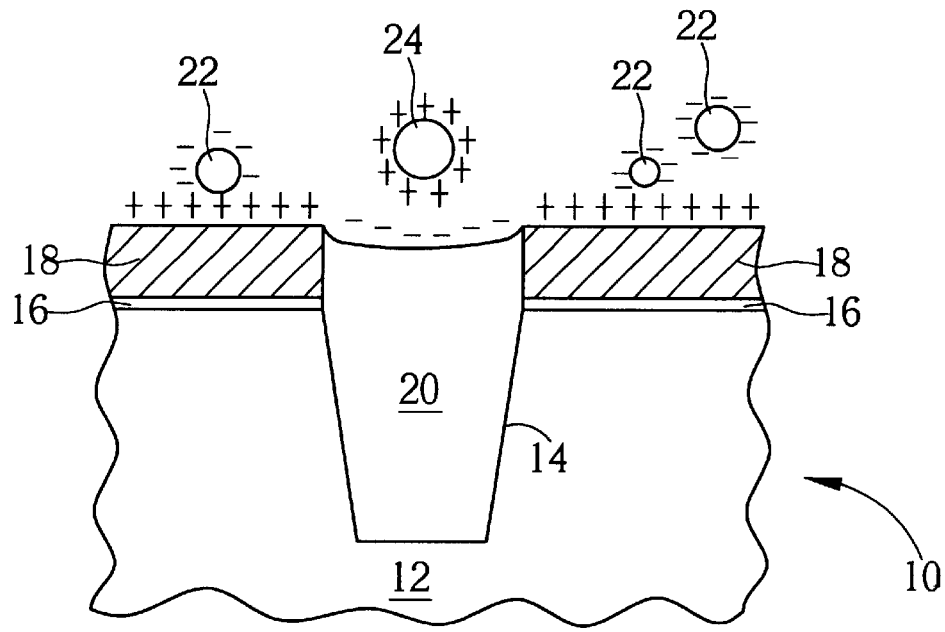
Figure 3:
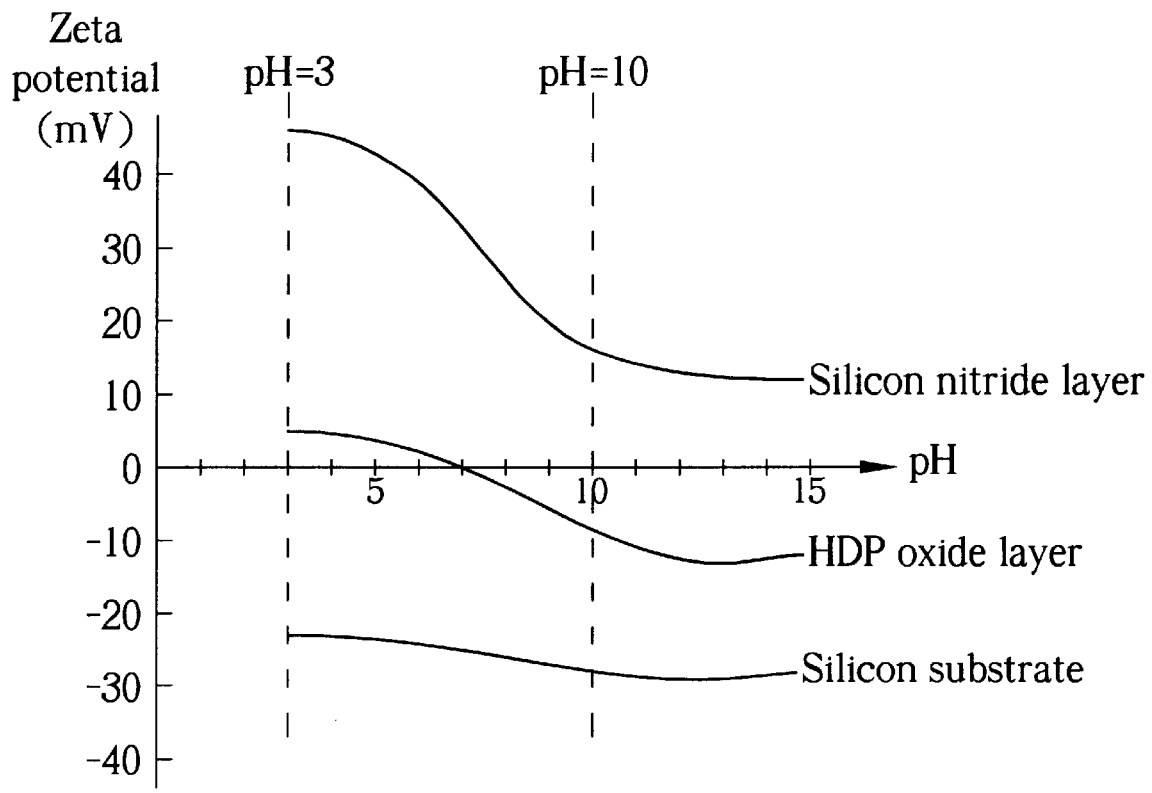
FIG. 3 is a relationship between the Zeta potential and the pH value.
Figure 5:
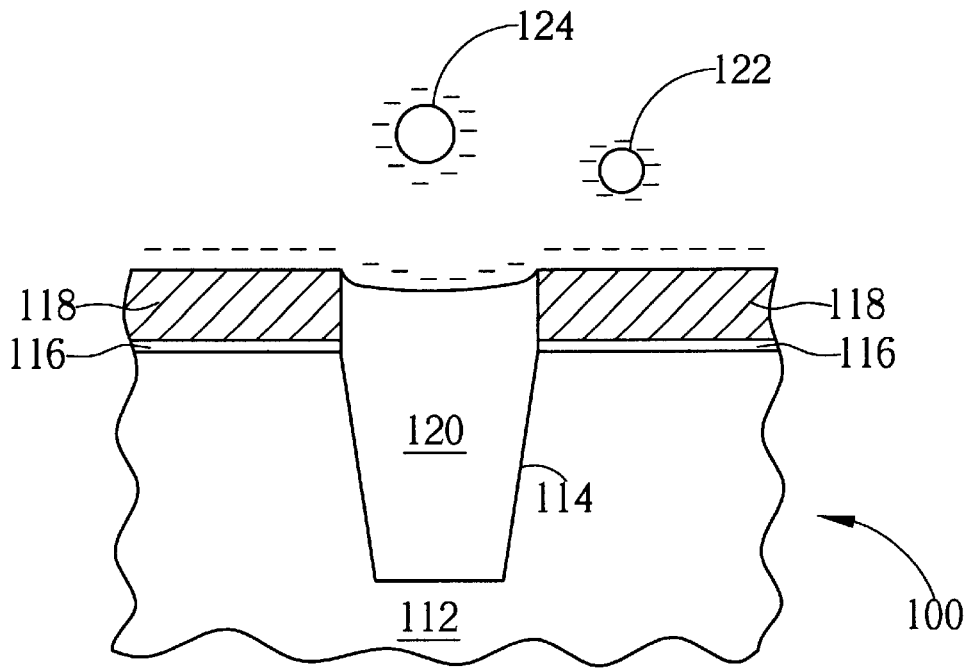
FIG. 5 is a schematic diagram of a result of adding surfactant during the CMP process according to the present invention.

Please refer to FIG. 5. FIG. 5 is a schematic diagram of a result of adding surfactant during the CMP process according to the present invention. As shown in FIG. 5, a surface of a semiconductor wafer 100 comprises a silicon substrate 112, a silicon oxide 116, a polishing stop layer 116, a trench 114 positioned on the surface of the silicon substrate 112 and down to the stop layer 118 and silicon oxide layer 116, and a silicon oxide layer 120 filling the trench 114. Wherein, the silicon nitride 114 is composed of a HDP oxide in the preferred embodiment of the present invention.

Because of the surfactant addition, Zeta potential on the surface of the polishing stop layer 118 that is composed of silicon nitride is reduced and has an negative potential as that of the silicon oxide layer 120. In addition, surface electric types of a micro-particle 122 in the. polishing slurry and that of a micro-particle 124 produced during the CMP process are also changed by the surfactant to have negative potentials. As a result, the attraction of static electricity between the micro-particle 122, 124 and the surface of the semiconductor wafer 100 is reduced, even forming a repellent effect, to achieve the aim of micro-particle control.

Above all, the present invention is applied in a planarization process of a surface of a semiconductor wafer 100 comprising a silicon oxide layer 120 and the silicon nitride 118. The method involves adding a certain amount of surfactant into a polishing slurry to perform a CMP process, so that the surface characteristics of the silicon oxide layer 120 and silicon nitride 118 is changed to control the microparticle adsorption effect on the surface of the semiconductor wafer 100. The surfactant is added into the polishing slurry after a predetermined time $T_1$ of the beginning of CMP process. Finally, a scrubbing process uses surfactant-containing solution to wash the semiconductor wafer 100, so as to totally remove the micro-particles from the surface of the semiconductor wafer 100 and complete the STI fabrication.

In contrast to the prior art method of removing micro-particles on the surface of semiconductor wafer, the present invention uses the surfactant to change the surface characteristic (Zeta potential) of the silicon nitride layer 118 and micro-particles 122, 124, so that the micro-particle adsorption effects is efficiently reduced during the CMP process. Moreover, the present invention is compatible with the present semiconductor process and is simple operation and very convenient for usage, thereby reducing the cost of removing the micro-particles on the surface of the semiconductor wafer.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for reducing micro-particle adsorption effects on a surface of a semiconductor wafer during processing of the semiconductor wafer, the semiconductor wafer comprising a silicon nitride layer and a plurality of micro-particles suspending over the surface of the semiconductor wafer, the method comprising contacting the silicon nitride layer surface with a chemical solution containing surfactants to ensure that the silicon nitride layer surface and the micro-particles bare the same type of charges to repel each other.

2. The method of claim 1 wherein the surface of the semiconductor wafer further comprises a silicon oxide layer made of-silicon dioxide, phosphosilicate glass, borophosphosilicate glass, or high-density plasma (HDP) oxide.

3. The method of claim 1 wherein the processing of the wafer is a chemical mechanical polishing (CMP) process and the chemical solution is a polishing slurry.

4. The method of claim 3 wherein the polishing slurry further comprises abrasive, deionized water (DI water), alkaline solvent, or buffer solution.

5. The method of claim 4 wherein the abrasive is made of fumed silica.

6. The method of claim 4 wherein the alkaline solvent is used to control the pH of the polishing slurry into a range of 7- to 13.

7. The method of claim 6 wherein the alkaline solvent comprises potassium hydroxide (KOH), sodium hydroxide (NaOH), or ammonia.

8. The method of claim 3 wherein the surfactants are added into the polishing slurry during the CMP process.

9. The method of claim 3 wherein the surfactants are added into the polishing slurry by near an end point of the CMP.

10. The method of claim 3 wherein the surfactants are added into the polishing slurry at the beginning of the CMP.

11. The method of claim 3 further comprising a scrubbing step after completing the CMP process.

12. The method of claim 11 wherein the scrubbing step comprises using surfactant-containing DI water to wash the semiconductor wafer.

13. The method of claim 3 further comprising a surfactant-containing SC-1 cleaning step after completing the CMP process.

14. The method of claim 1 wherein the surfactants comprise cationic surfactants, anionic surfactants, amphoteric surfactants, or nonionic surfactants.

15. The method of claim 14 wherein the surfactants comprise quaternary ammonium halide surfactants, phosphate surfactants, dialkyl sulfosuccinates, betaines, sulfate surfactants, ethylene oxide derivatives (EOD), phenols, or acid amines.

16. A method for reducing micro-particle adsorption effects on a surface of a semiconductor wafer after a CMP process, the semiconductor wafer comprising a silicon nitride layer and a plurality of micro-particles produced during the CMP process, the method comprising contacting the silicon nitride layer surface with a chemical solution containing surfactants to ensure that the silicon nitride layer surface and the micro-particles bare the same type of charges to repel each other.

17. The method of claim 16 wherein the surface of the semiconductor wafer further comprises a silicon oxide layer made of silicon dioxide, phosphosilicate glass, borophosphosilicate glass, or high-density plasma (HDP) oxide.

18. The method of claim 16 wherein the surfactants comprise cationic surfactants, anionic surfactants, amphoteric surfactants, or nonionic surfactants.

19. The method of claim 18 wherein the surfactants comprise quaternary ammonium halide surfactants, phosphate surfactants, dialkyl sulfosuccinates, betaines, sulfate surfactants, ethylene oxide derivatives (EOD), phenols, or acid amines.

* * * * *